(12) United States Patent
Yamasaki et al.

(10) Patent No.: US 11,158,888 B2
(45) Date of Patent: Oct. 26, 2021

(54) MANAGEMENT DEVICE AND POWER STORAGE SYSTEM

(71) Applicant: Panasonic Intellectual Property Management Co., Ltd., Osaka (JP)

(72) Inventors: Jun Yamasaki, Hyogo (JP); Etsushi Aga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 431 days.

(21) Appl. No.: 15/752,702

(22) PCT Filed: Jan. 20, 2017

(86) PCT No.: PCT/JP2017/001883
§ 371 (c)(1),
(2) Date: Feb. 14, 2018

(87) PCT Pub. No.: WO2017/135069
PCT Pub. Date: Aug. 10, 2017

(65) Prior Publication Data
US 2018/0241097 A1 Aug. 23, 2018

(30) Foreign Application Priority Data
Feb. 1, 2016 (JP) .............................. JP2016-017426

(51) Int. Cl.
| | |
|---|---|
| *H01M 10/44* | (2006.01) |
| *G01R 31/392* | (2019.01) |
| *H02J 7/02* | (2016.01) |
| *G01R 31/3842* | (2019.01) |
| *H01M 10/48* | (2006.01) |

(Continued)

(52) U.S. Cl.
CPC ...... *H01M 10/441* (2013.01); *G01R 31/3842* (2019.01); *G01R 31/392* (2019.01);
(Continued)

(58) Field of Classification Search
CPC .. H01M 10/441; H01M 10/482; H02J 7/0013; G01R 31/392
(Continued)

(56) References Cited

U.S. PATENT DOCUMENTS

| | | | |
|---|---|---|---|
| 9,030,167 B2 * | 5/2015 | Yamaguchi | H01M 10/441 320/119 |
| 10,243,384 B2 * | 3/2019 | Chen | H02J 7/0068 |

(Continued)

FOREIGN PATENT DOCUMENTS

| | | |
|---|---|---|
| EP | 1837944 | 9/2007 |
| EP | 2424070 | 2/2012 |

(Continued)

OTHER PUBLICATIONS

International Search Report of PCT application No. PCT/JP2017/001883 dated Mar. 14, 2017.

*Primary Examiner* — Richard V Muralidar
(74) *Attorney, Agent, or Firm* — McDermott Will and Emery LLP

(57) ABSTRACT

A management device manages a plurality of power storage devices interconnected in parallel. In the management device, a halt controller halts an operation of at least one of the plurality of power storage devices during a period in which charged/discharged power between the plurality of power storage devices and a load is less than a set value. During the period in which the charged/discharged power is less than the set value, for example, the halt controller, by turns, halts an operation of one of the plurality of power storage devices at a set time interval.

4 Claims, 10 Drawing Sheets

(51) Int. Cl.
  *H02J 7/00*      (2006.01)
  *G01R 19/165*    (2006.01)
  *H02J 5/00*      (2016.01)
  *H01M 10/42*     (2006.01)

(52) U.S. Cl.
  CPC ......... *H01M 10/48* (2013.01); *H01M 10/482* (2013.01); *H02J 7/0013* (2013.01); *H02J 7/02* (2013.01); *G01R 19/16542* (2013.01); *H01M 10/4257* (2013.01); *H02J 5/00* (2013.01)

(58) Field of Classification Search
  USPC ....................................................... 320/126
  See application file for complete search history.

(56) References Cited

U.S. PATENT DOCUMENTS

| | | | |
|---|---|---|---|
| 2011/0127964 A1 | 6/2011 | Nishida et al. | |
| 2014/0079960 A1* | 3/2014 | Yun ..................... | H01M 10/482 |
| | | | 429/7 |
| 2019/0109306 A1* | 4/2019 | Nishikawa ................ | H02J 1/10 |

FOREIGN PATENT DOCUMENTS

| | | |
|---|---|---|
| EP | 2424070 A2 * | 9/2012 |
| JP | 2007-259612 | 10/2007 |
| JP | 2009-044851 | 2/2009 |
| JP | 2010-045923 | 2/2010 |
| JP | 2012-050213 | 3/2012 |
| JP | 2013-027243 | 2/2013 |

* cited by examiner

MANAGEMENT DEVICE AND POWER STORAGE SYSTEM

This application is a U.S. national stage application of the PCT International Application No. PCT/JP2017/001883 filed on Jan. 20, 2017, which claims the benefit of foreign priority of Japanese patent application 2016-017426 filed on Feb. 1, 2016, the contents all of which are incorporated herein by reference.

TECHNICAL FIELD

The present invention relates to a management device that manages power storage devices and to a power storage system.

BACKGROUND ART

For frequency regulation (FR) of commercial electric power systems (abbreviated below as power systems) which is made to stabilize their frequencies, power storage systems are now practically used. The trades of ancillary services using power storage systems have already started in the US market.

Power systems provide stable frequencies by keeping the balance between their power demand and supply. However, some modern power systems are connected to many power generating systems using renewable energy, including photovoltaic and wind power generating systems. Such power generating systems may supply fluctuated power to the power supply. When the power supply to a power system exceeds its power demand, the frequency tends to decrease. When the power demand exceeds the power supply, the frequency tends to increase.

In the FR using a power storage system, when the power supply to the power system exceeds its power demand by a predetermined amount or above, the power storage system is charged by the power system. When the power demand exceeds the power supply by a predetermined amount or above, the power storage system discharges the power to the power system. In this way, the balance between the power demand and supply in the power system is kept. As a result, the frequency of the power from the power system is stabilized.

There are some commercially practical apparatuses equipped with both a power generating system using renewable energy and a power storage system. These apparatuses can smooth power that the power generating system using renewable energy outputs to the power system. Such apparatuses can help stabilize the frequency of the power system.

Deterioration of a storage battery is of two kinds; an irreversible deterioration and a reversible deterioration. It is possible to improve the reversible deterioration by halting an operation of a storage battery, but it is not possible to improve the irreversible deterioration even by halting the operation of the storage battery. An example of the irreversible deterioration is a cycle deterioration, which is a deterioration accelerated with an increasing number of times of charging/discharging improvements. An example of the reversible deterioration is a temporal deterioration attributed to heat generation.

A power storage system used for an ancillary service, as described above, basically continues to operate all day long. When natural ambience such as solar irradiance or a load greatly varies, the power storage system may be charged with or discharge high power. In such an application in which charging and discharging with a large current are sequentially performed, the power storage system may generate high heat, undergoing the reversible deterioration. By halting the operation of the storage batteries to cool them down, the reversible deterioration can be improved.

As a conceivable example, PTL 1 discloses a control technique by which one of a plurality of storage batteries interconnected in parallel halts its operation by turns.

CITATION LIST

Patent Literature

PTL 1: Unexamined Japanese Patent Publication No. 2013-027243

SUMMARY OF THE INVENTION

In the above control technique by which one of a plurality of storage batteries interconnected in parallel halts its operation by turns, if a load connected to the storage batteries increases, the burden on each of the storage batteries may also increase.

The present invention addresses the above situations with an object of providing a technique that is applicable to a power storage system including a plurality of power storage devices interconnected in parallel and that suppresses an increase in an electric-current burden on the power storage devices but suppresses their deteriorations.

According to an aspect of the present invention, a management device that addresses the above situations manages a plurality of power storage devices interconnected in parallel. This management device includes a halt controller that halts an operation of at least one of the plurality of power storage devices during a period in which charged/discharged power between the plurality of power storage devices and a load is less than a set value.

Any desired combinations of the above-described components and converted expressions of the present invention in methods, devices, systems, and other similar entities are still effective as aspects of the present invention.

The present invention makes it possible to suppress an increase in an electric-current burden on a plurality of power storage devices interconnected in parallel in a power storage system but to suppress deteriorations of the power storage devices.

DESCRIPTION OF EMBODIMENTS

Figure 1:
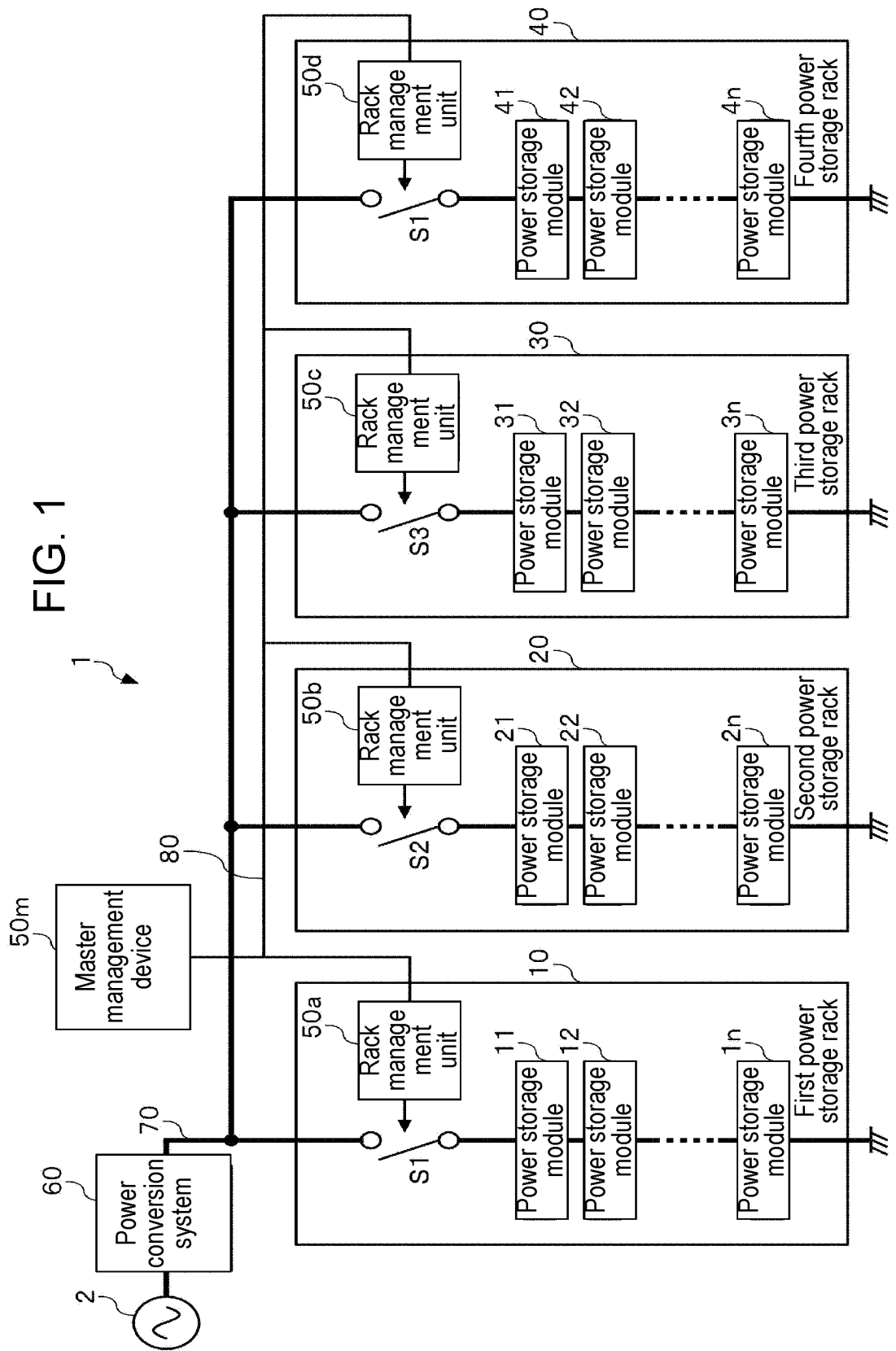
FIG. 1 is a view of a configuration of a power storage system according to an exemplary embodiment of the present invention.

FIG. 1 is a view of a configuration of power storage system 1 according to an exemplary embodiment of the present invention. Power storage system 1 includes: a plurality of power storage racks 10 to 40 interconnected in parallel; and power conversion system 60. In the example of FIG. 1, four power storage racks (first power storage rack 10, second power storage rack 20, third power storage rack 30, and fourth power storage rack 40) are interconnected in parallel. Between the plurality of power storage racks 10 to 40 and power system 2 is power conversion system 60 connected.

Power conversion system 60 converts direct current (DC) power discharged from the plurality of power storage racks 10 to 40 into alternating current (AC) power and then outputs this AC power to power system 2. In addition, power conversion system 60 converts AC power received from power system 2 into DC power and then charges the plurality of power storage racks 10 to 40 interconnected in parallel with this DC power. Power conversion system 60, which may be implemented by a typical power conditioner system, includes an unillustrated bi-directional DC/DC converter and inverter. The bi-directional DC/DC converter controls charging/discharging with constant current (CC) or constant voltage (CV). The bi-directional inverter converts the DC power into the AC power or the AC power into the DC power.

First power storage rack 10 includes: a plurality of power storage modules 11 to 1*n* interconnected in series; first rack management unit 50*a*; and first switch S1. Examples of the power storage modules include a lithium ion battery module, a nickel hydrogen battery module, a lead-acid battery module, and an electric double-layer capacitor module.

First switch S1 is connected between power line 70 extending to power conversion system 60 and the plurality of power storage modules 11 to 1*n*. Examples as first switch S1 include a relay and a breaker. First rack management unit 50*a* controls an on/off operation of first switch S1.

Figure 2:
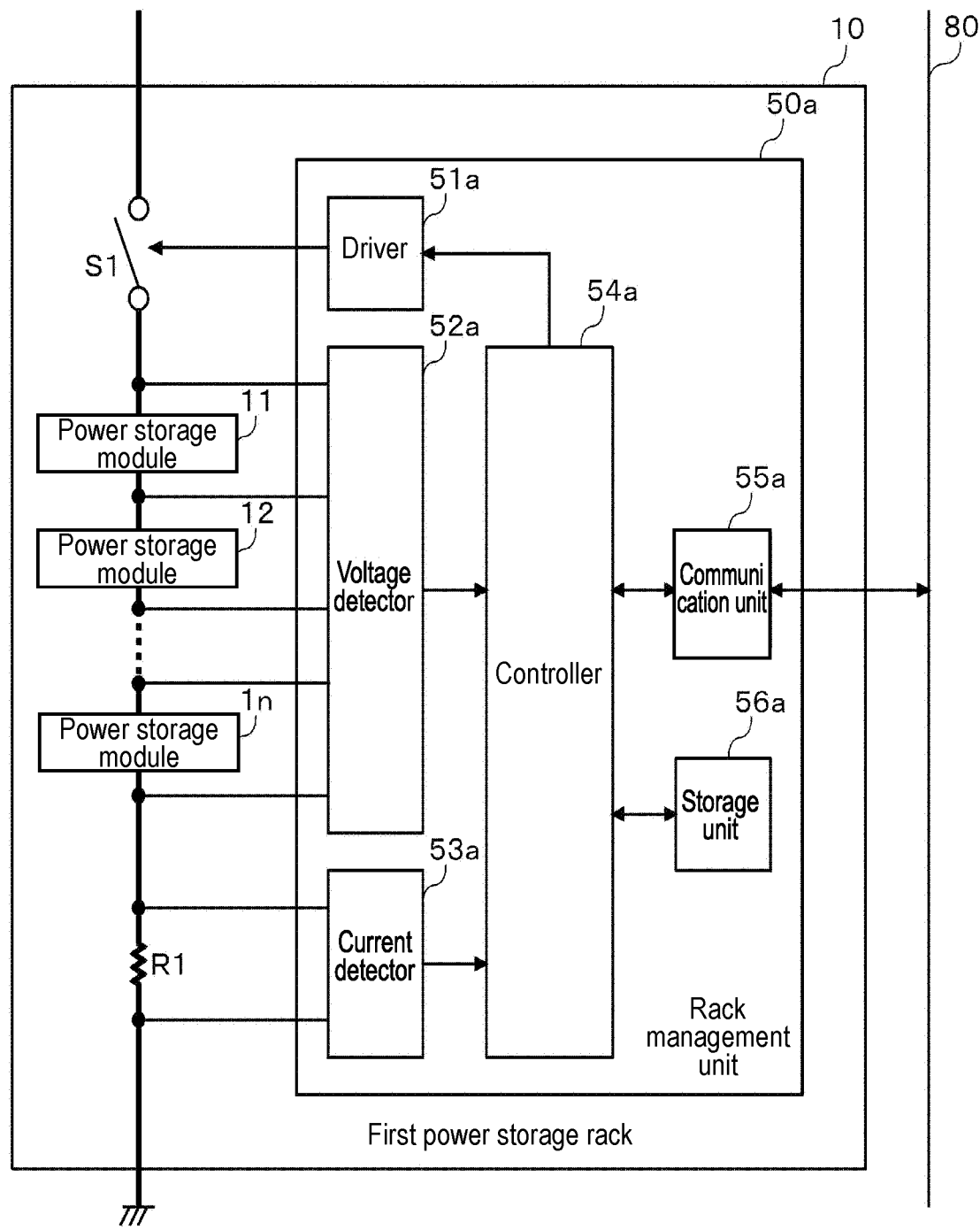
FIG. 2 is an explanatory view of details of the first power storage rack in FIG. 1.

FIG. 2 is an explanatory view of details of first power storage rack 10 in FIG. 1. First rack management unit 50*a* manages the plurality of power storage modules 11 to 1*n*. In addition, first rack management unit 50*a* communicates with other rack management units (second rack management unit 50*b*, third rack management unit 50*c*, and fourth rack management unit 50*d*) and master management device 50*m* over communication line 80. Examples as communication line 80 include: a metal cable conforming to the recommended standard RS-485 specifications; and an optical fiber cable.

First rack management unit 50*a* includes driver 51*a*, voltage detector 52*a*, current detector 53*a*, controller 54*a*, communication unit 55*a*, and storage unit 56*a*. Driver 51*a* generates a switch drive signal, based on a switch control signal received from controller 54*a*, driving first switch S1.

Voltage detector 52*a* detects a voltage of each of the plurality of power storage modules 11 to 1*n*. In addition, voltage detector 52*a* outputs the detected voltage of each of the plurality of power storage modules 11 to 1*n* to controller 54*a*. Current detector 53*a* measures a voltage across resistor R1 (shunt resistor) inserted into a current path of the plurality of power storage modules 11 to 1*n*, thereby detecting a current flowing through the plurality of power storage modules 11 to 1*n*. In addition, current detector 53*a* outputs the detected current flowing through the plurality of power storage modules 11 to 1*n* to controller 54*a*. Each of voltage detector 52*a* and current detector 53*a* may be implemented by an application-specific integrated circuit (ASIC), for example. Instead of shunt resistor Rs, another current sensing element such as a Hall element may be used.

Communication unit 55*a* performs a predetermined communication control process such as a communication control process conforming to the RS-485 specifications. In addition, communication unit 55*a* conducts serial communication with other rack management units 50*b* to 50*d* or a communication unit in master management device 50*m* over communication line 80.

A configuration of controller 54*a* may be implemented by either cooperation of hardware and software resources or hardware resources alone. Examples of the hardware resources include a microcomputer, a digital signal processor (DSP), a field-programmable gate array (FPGA), and other large-scale integrated circuits (LSIs). The software resources may be programs such as firmware. Storage unit 56*a* may be implemented by read only memory (ROM) or random access memory (RAM).

When overvoltage, undervoltage, or overcurrent occurs, controller 54*a* outputs the switch control signal to driver 51*a* in order to turn off first switch S1. Furthermore, controller 54*a* outputs the switch control signal to driver 51*a* based on an instruction signal from master management device 50*m*, thereby turning on or off first switch S1.

Controller 54*a* estimates a state of charge (SOC) and state of health (SOH) of each of the plurality of power storage modules 11 to 1*n*. This estimation is made based on the voltages of the plurality of power storage modules 11 to 1*n* which have been detected by voltage detector 52*a* and the current flowing through the plurality of power storage modules 11 to 1*n* which has been detected by current detector 53*a*. This SOC estimation may be made using an open circuit voltage (OCV) method or a current integration method. Since each of these methods is a typical technique, details of the methods will not be described.

The SOH estimation may be made from measurements of internal resistances of the power storage modules 11 to 1*n*. It is possible to estimate a present full charge capacity of a storage battery based on its internal resistance, because the internal resistance correlates with lowering of the full charge capacity. The internal resistances of the power storage modules 11 to 1*n* may be measured based on a ratio of detected voltages to a given current, where the detected voltages are voltages across respective power storage modules 11 to 1*n* when the given current flows through power storage modules 11 to 1*n*. The SOH can be determined from a ratio of a present full charge capacity (Ah) to an initial full charge capacity (Ah). By estimating the present full charge capacity, therefore, the SOH estimation can be made.

Controller 54*a* reports monitor data to master management device 50*m* over communication line 80 at regular time intervals. This monitor data contains at least one of the voltages, SOCs, and SOHs of the plurality of power storage modules 11 to 1*n* and the current flowing through the plurality of power storage modules 11 to 1*n*. It should be noted that the description of the configuration of first power storage rack 10 in FIG. 2 applies to configurations of second power storage rack 20 to fourth power storage rack 40.

Therefore, details of configurations of second power storage rack 20 to fourth power storage rack 40 will not be described.

Figure 3:
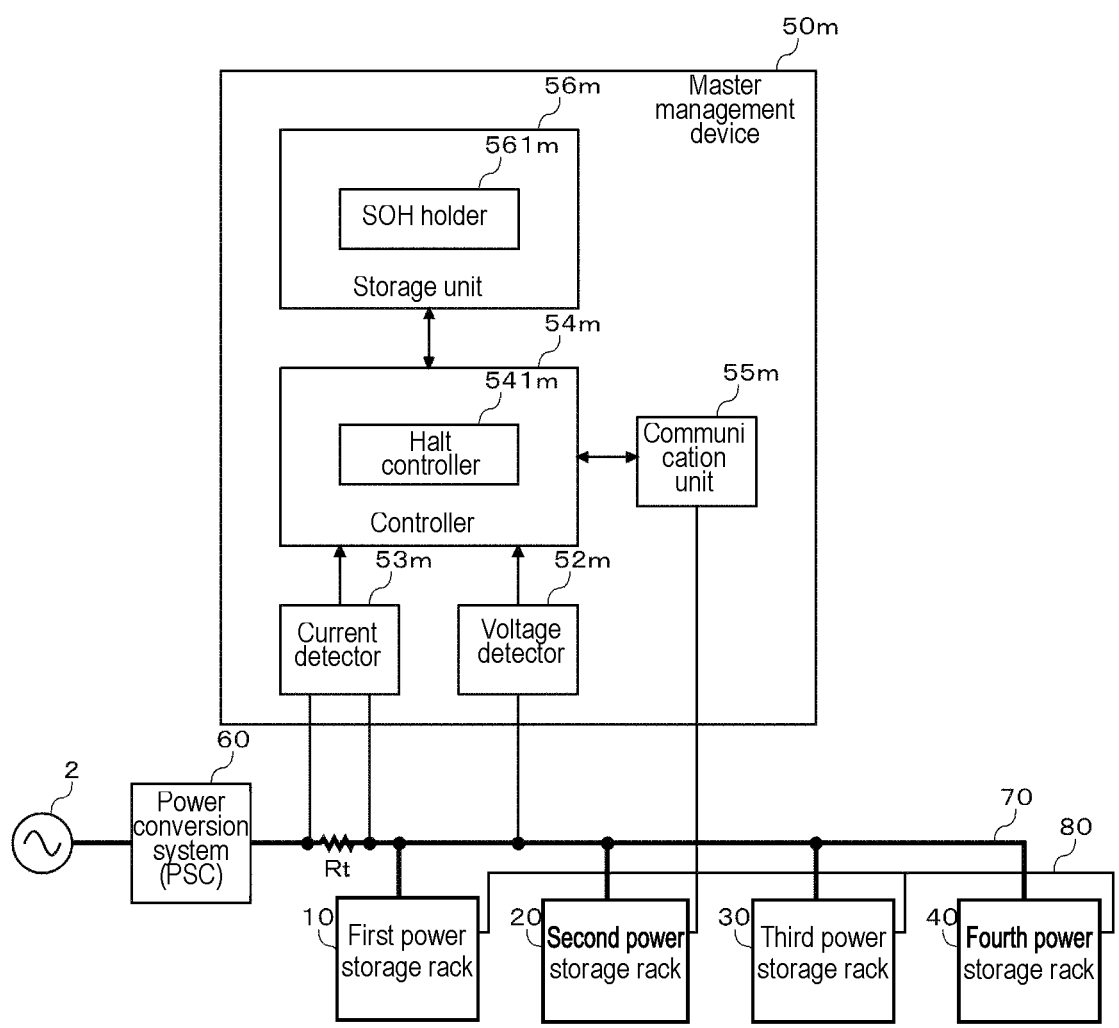
FIG. 3 is an explanatory view of details of the master management device in FIG. 1.

FIG. 3 is an explanatory view of details of master management device 50m in FIG. 1. Master management device 50m manages the plurality of power storage racks 10 to 40 by communicating with rack management units 50a to 50d over communication line 80. Furthermore, master management device 50m may be communicable with an unillustrated external management device for a system operator and/or an unillustrated management device for a power system operator.

Master management device 50m includes voltage detector 52m, current detector 53m, controller 54m, communication unit 55m, and storage unit 56m. Voltage detector 52m detects a voltage on power line 70 and then outputs the detected voltage to controller 54m. Current detector 53m detects a current flowing along power line 70 by measuring a voltage across resistor (shunt resistor) Rt inserted into power line 70. Resistor Rt is inserted into power line 70 on a side of power conversion system 60 with respect to all the nodes branching to the plurality of power storage racks 10 to 40. Current detector 53m outputs the detected current flowing along power line 70 to controller 54m. This detected current corresponds to a charged/discharged current of all the plurality of power storage racks 10 to 40. Communication unit 55m performs a predetermined communication control process and conducts serial communication with communication units 55a to 55d in the plurality of rack management units 50a to 50d, respectively, over communication line 80.

A configuration of controller 54m may be implemented by either cooperation of hardware and software resources or hardware resources alone. Examples of the hardware resources include a microcomputer, a DSP, a FPGA, and other LSIs. The software resources may be programs such as firmware. Storage unit 56m may be implemented by a ROM or a RAM.

Controller 54m includes halt controller 541m. Halt controller 541m halts an operation of at least one of the plurality of power storage racks 10 to 40. A specific example of the halt control will be described later. Storage unit 56m includes SOH holder 561m. SOH holder 561m is a table in which SOHs acquired from the plurality of power storage racks 10 to 40 are held.

Figure 4:
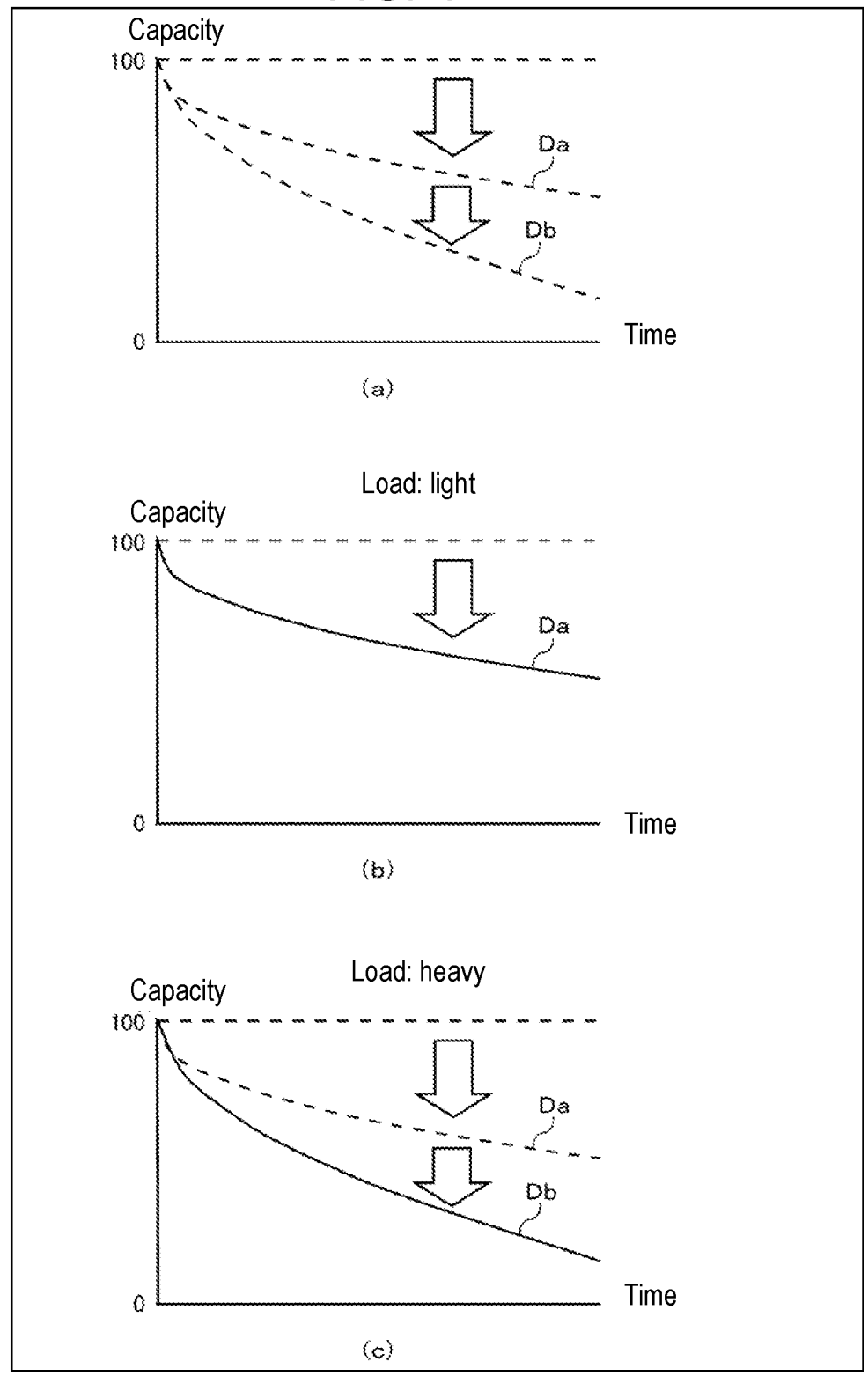
FIG. 4 is an explanatory view of irreversible and reversible deteriorations of a power storage rack.

FIG. 4 is an explanatory view of irreversible and reversible deteriorations of a power storage rack. Irreversible deterioration property Da illustrated in (a) to (c) of FIG. 4 is a deterioration property that can be seen in all types of lithium ion batteries. This irreversible deterioration property Da accelerates with time, independently of a charged/discharged load. Reversible deterioration property Db illustrated in (a) and (c) of FIG. 4 is a deterioration property that can be seen in a case where continuous charging and discharging with a large capacity are performed for a long time. As illustrated in (b) of FIG. 4, reversible deterioration property Db does not occur, or is not prominent when a light load is charged or discharges.

Figure 5:
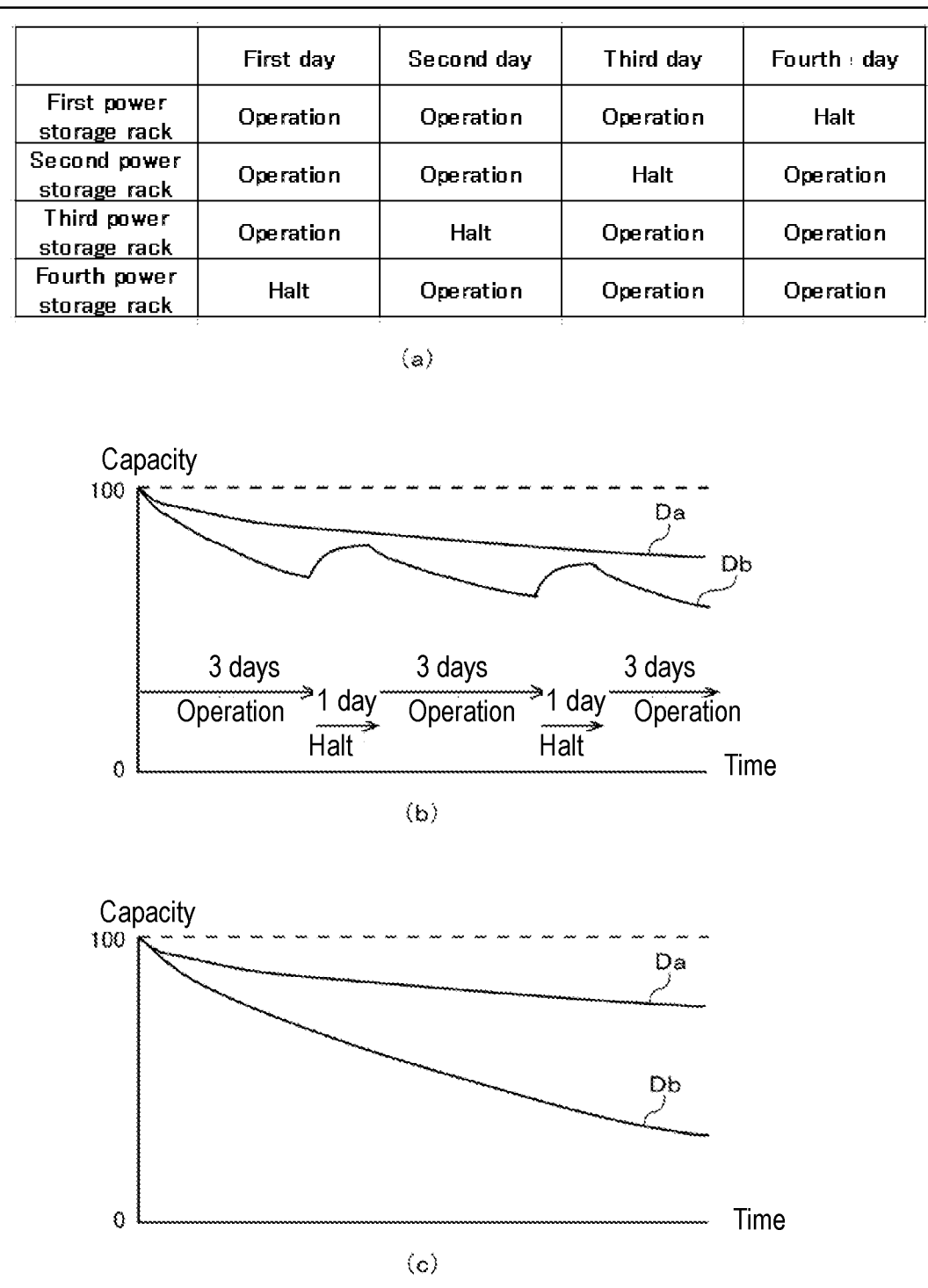
FIG. 5 is an explanatory view of halt control, according to a first exemplary embodiment, of power storage racks.

FIG. 5 is an explanatory view of halt control, according to a first exemplary embodiment, of power storage racks. In the first exemplary embodiment, halt controller 541m, by turns, halts one of the plurality of power storage racks 10 to 40 at set time intervals. In an example that will be described, the set time interval is one day (24 hours). On the first day, as illustrated in (a) of FIG. 5, halt controller 541m operates first power storage rack 10, second power storage rack 20, and third power storage rack 30 but halts an operation of fourth power storage rack 40. On the second day, halt controller 541m operates first power storage rack 10, second power storage rack 20, and fourth power storage rack 40 but halts an operation of third power storage rack 30. On the third day, halt controller 541m operates first power storage rack 10, third power storage rack 30, and fourth power storage rack 40 but halts an operation of second power storage rack 20. On the fourth day, halt controller 541m operates second power storage rack 20, third power storage rack 30, and fourth power storage rack 40 but halts an operation of first power storage rack 10. By repeating these control operations, each power storage rack is scheduled to operate for three days and then halt its operation for one day.

The section (b) of FIG. 5 illustrates irreversible deterioration property Da and reversible deterioration property Db of each power storage rack when the above control operations are performed. The section (c) of FIG. 5 illustrates irreversible deterioration property Da and reversible deterioration property Db of each power storage rack when the above control operations are not performed, in other words, when each power storage rack continues to operate without halting. As can be seen from (b) of FIG. 5, reversible deterioration property Db improves during each halt period. Thus, the halt control operation according to the first exemplary embodiment can greatly improve reversible deterioration property Db, in comparison with the control operation in (c) of FIG. 5 which provides no halt time intervals.

Figure 6:
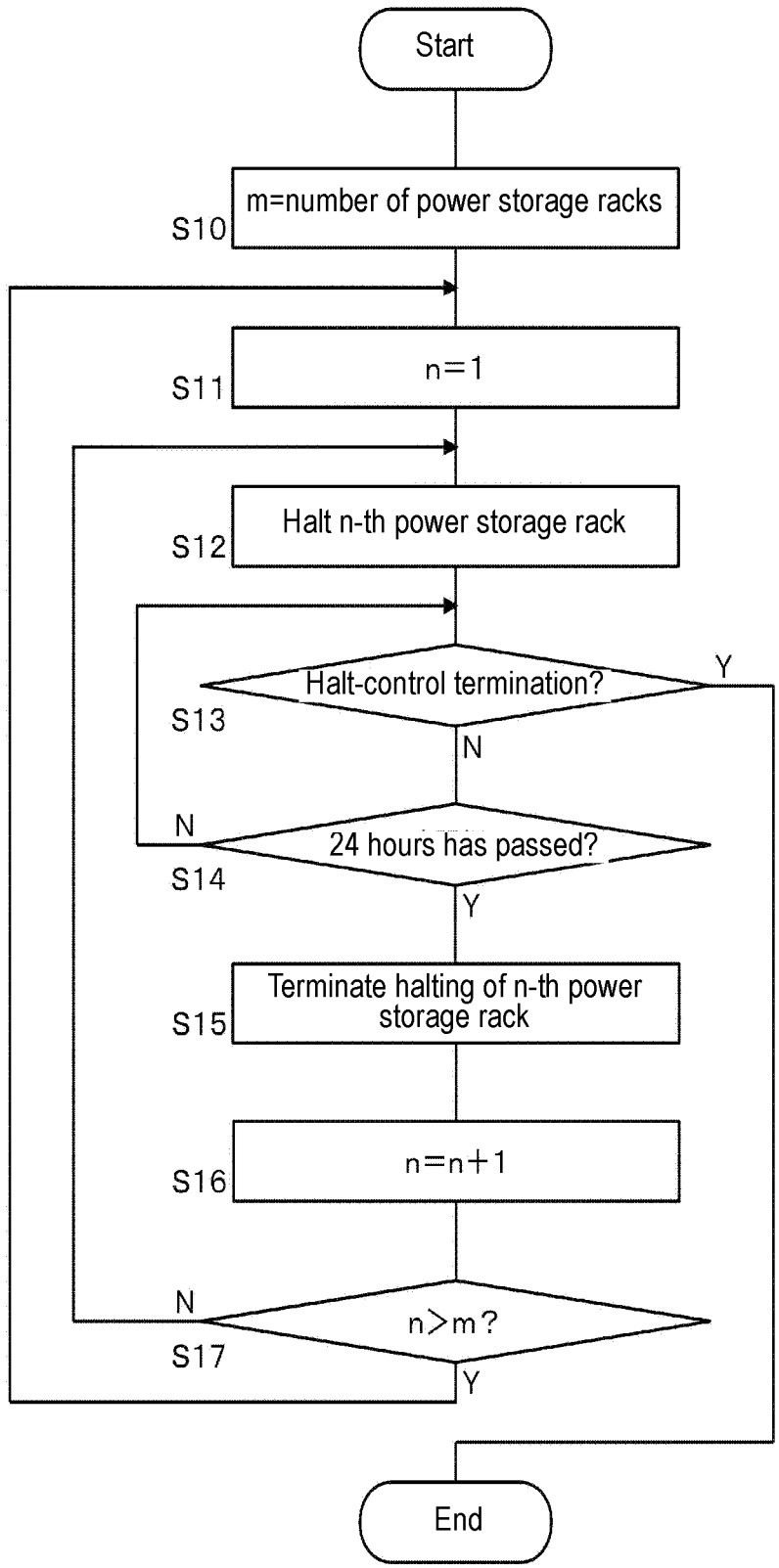
FIG. 6 is a flowchart of the halt control, according to the first exemplary embodiment, of the power storage racks.

FIG. 6 is a flowchart of the halt control, according to the first exemplary embodiment, of the power storage racks. First, halt controller 541m sets constant m to the number of power storage racks (four in this example) (S10), and then sets parameter n to one as an initial value (S11). Halt controller 541m halts an operation of an n-th power storage rack (S12). When receiving a halt-control termination instruction for the power storage racks within the halt time interval (Y in S13), halt controller 541m terminates the entire process in the halt control.

When not receiving the halt-control termination instruction for the power storage racks within the halt time interval (N in S13), halt controller 541m determines whether 24 hours has passed since the operation of the n-th power storage rack was halted (S14). When 24 hours have not passed yet (N in S14), the process returns to step S13. When 24 hours have already passed (Y in S14), halt controller 541m terminates the halting of the n-th power storage rack (S15). Halt controller 541m increments parameter n (S16). Halt controller 541m compares parameter n with constant m. When parameter n is equal to or less than constant m (N in S17), the process returns to step S12. When parameter n exceeds constant m (Y in S17), the process returns to step S11.

The first exemplary embodiment is effective in suppressing the reversible deterioration of power storage racks. However, there arises a problem that a heavy electric-current burden may be placed on each power storage rack when a heavy load is charged or discharges. In this case, a high-spec circuit part is required for the heavy electric-current burden, which may lead to an increase in the overall cost. Moreover, the entire capacity of power storage system 1 is lowered during each halt control. In this case, its ancillary and smoothing performances directed for power system 2 may also be lowered. This might increase the risk of profit opportunities being missed in the market for ancillary services, especially in the USA. A second exemplary embodiment that will be described below can overcome this problem.

Figure 7:
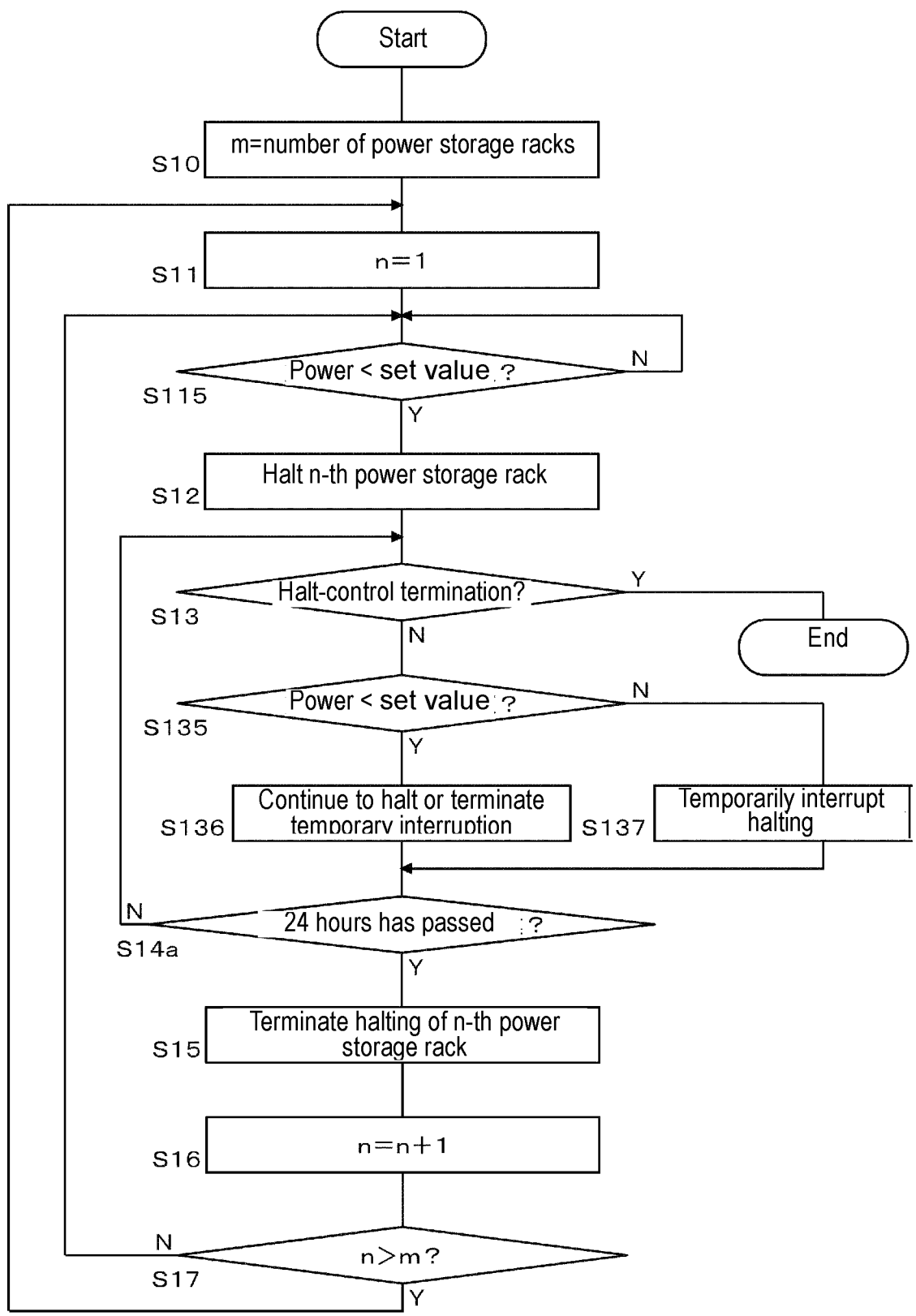
FIG. 7 is a flowchart of halt control, according to a second exemplary embodiment, of the power storage racks.

FIG. 7 is a flowchart of the halt control, according to the second exemplary embodiment, of the power storage racks.

Similar to the first exemplary embodiment, first, halt controller 541m sets constant m to the number of power storage racks (four in this example) (S10), and then sets parameter n to one as an initial value (S11). In the second exemplary embodiment, halt controller 541m compares total charged/discharged power of the plurality of power storage racks 10 to 40 with a set value (S115). For example, this charged/discharged power may be determined from the product of a voltage detected by voltage detector 52m and a current detected by current detector 53m. The set value may be determined by a designer, based on specifications for each power storage rack, the number of power storage racks interconnected in parallel, and an experimental or simulation result.

When the charged/discharged power is equal to or more than the set value (N in S115), halt controller 541m continues to perform a normal operation without halting the operation of any of the power storage racks. When the charged/discharged power is less than the set value (Y in S115), halt controller 541m halts an operation of an n-th power storage rack (S12). When receiving the halt-control termination instruction for the power storage racks within the halt time interval (Y in S13), halt controller 541m terminates the entire process in the halt control.

When not receiving the halt-control termination instruction (N in S13), halt controller 541m compares the total charged/discharged power of the plurality of power storage racks 10 to 40 with the set value (S135). When the charged/discharged power is equal to or more than the set value (N in S135), halt controller 541m temporarily interrupts the halting of the n-th power storage rack (S137). When the charged/discharged power is less than the set value (Y in S135), halt controller 541m continues to halt the operation of the n-th power storage rack. Alternatively, if the halting of the n-th power storage rack is temporarily interrupted, halt controller 541m terminates the interruption, halting the operation of the n-th power storage rack again (S136).

Halt controller 541m determines whether an accumulated time that has passed since the operation of the n-th power storage rack was halted reaches 24 hours (S14a). When the accumulated time has not reached 24 hours yet (N in S14a), the process returns to step S13. When the accumulated time has already reached 24 hours (Y in S14a), halt controller 541m terminates the halting of the n-th power storage rack (S15). Halt controller 541m increments parameter n (S16). Halt controller 541m compares parameter n with constant m. When parameter n is equal to or less than constant m (N in S17), the process returns to step S115. When parameter n exceeds constant m (Y in S17), the process returns to step S11.

As described above, the second exemplary embodiment makes it possible to suppress the reversible deteriorations of the power storage racks by providing each power storage rack with a halt time interval. When a heavy load is charged or discharges, all of the power storage racks switch to a charge/discharge mode. This operation can control an increase in an electric-current burden on each power storage rack. Decreasing a maximum current flowing through a power storage rack contributes to a long lifetime of each power storage rack. Furthermore, the second exemplary embodiment does not require any circuit part conforming to high specifications associated with a drive current. This leads to the reduction in an overall cost. Moreover, the second exemplary embodiment makes it possible to avoid lowering of ancillary and smoothing performances of entire power storage system 1 intended for power system 2.

In the flowchart of FIG. 7 according to the second exemplary embodiment, when the charged/discharged power is equal to or more than the set value in step S135 (N in S135), halt controller 541m performs the process of temporarily interrupting the halting of the n-th power storage rack (S137), and then the process of determining whether the accumulated time reaches 24 hours (S14a). However, when the charged/discharged power is equal to or more than the set value in step S135 (N in S135), halt controller 541m may skip the process of temporarily interrupting the halting of the n-th power storage rack (S137) and may directly perform the process of terminating the halting of the n-th power storage rack in step S15. After having temporarily interrupted the halting of a power storage rack, halt controller 541m does not necessarily have to halt the same power storage rack again. Alternatively, halt controller 541m may halt the operation of the power storage rack in the next order. Operating the power storage system in this manner is effective in improving overall deterioration, because a reversible deterioration of a power storage rack improves at the highest rate immediately after the operation of the power storage rack is halted.

Figure 8:
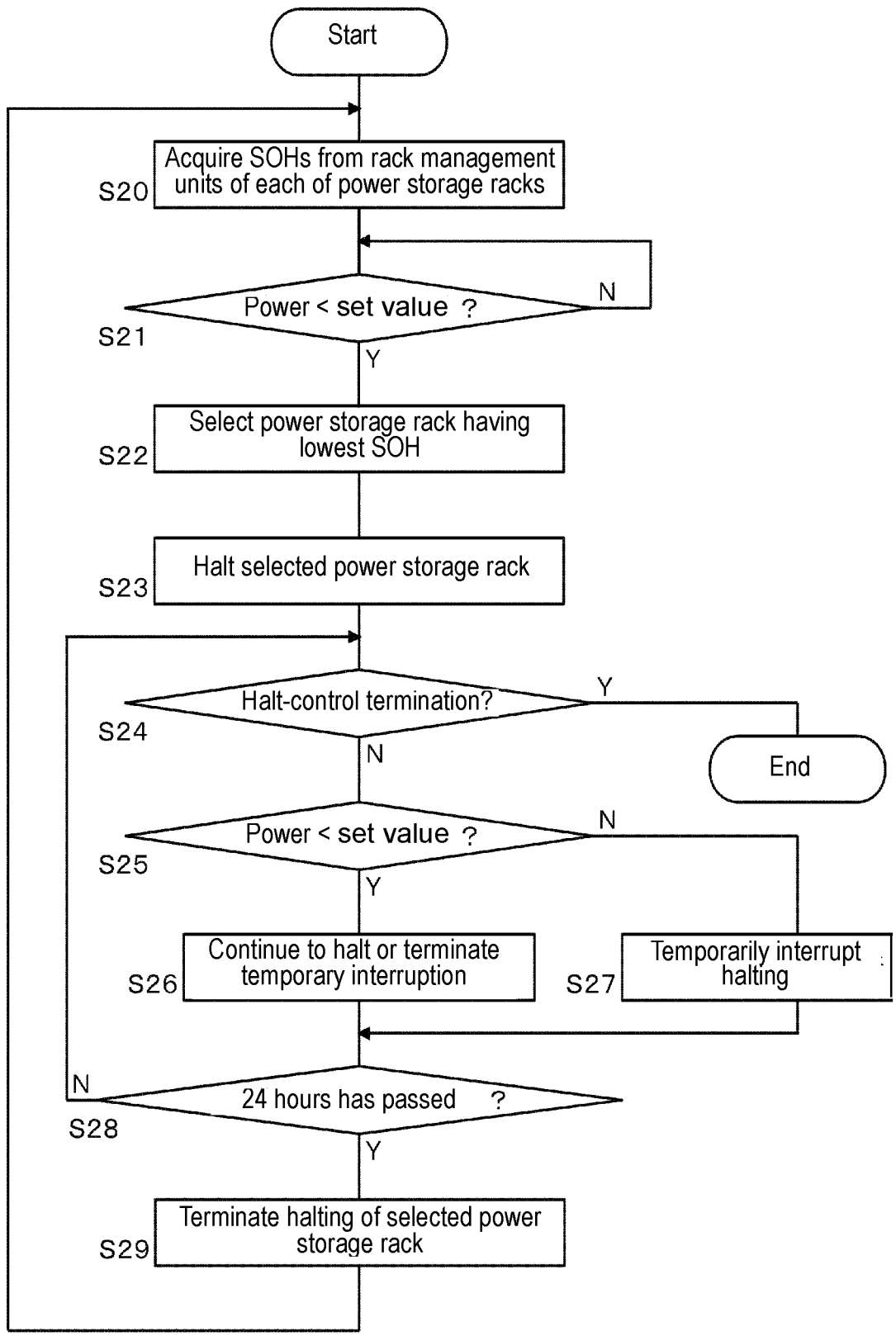
FIG. 8 is a flowchart of halt control, according to a third exemplary embodiment, of the power storage racks.

FIG. 8 is a flowchart of halt control, according to a third exemplary embodiment, of the power storage racks. Halt controller 541m acquires SOHs of the plurality of power storage racks 10 to 40 from rack management units 50a to 50d in the plurality of power storage racks 10 to 40, respectively, over communication line 80 (S20). Using the acquired SOHs, halt controller 541m updates SOHs in SOH holder 561m.

Halt controller 541m compares total charged/discharged power of the plurality of power storage racks 10 to 40 with the set value (S21). When the charged/discharged power is equal to or more than the set value (N in S21), halt controller 541m continues to perform the normal operation. When the charged/discharged power is less than the set value (Y in S21), halt controller 541m selects one of the power storage racks which has the lowest SOH (S22). Then, halt controller 541m halts an operation of the selected power storage rack (S23). When receiving a halt-control termination instruction for the power storage racks within the halt time interval (Y in S24), halt controller 541m terminates the entire process in the halt control.

When not receiving the halt-control termination instruction (N in S24), halt controller 541m compares the total charged/discharged power of the plurality of power storage racks 10 to 40 with the set value (S25). When the charged/discharged power is equal to or more than the set value (N in S25), halt controller 541m temporarily interrupts the halting of the selected power storage rack (S27). When the charged/discharged power is less than the set value (Y in S25), halt controller 541m continues to halt the operation of the selected power storage rack. Alternatively, if the halting of the selected power storage rack is temporarily interrupted, halt controller 541m terminates the interruption, halting the operation of the n-th power storage rack again (S26).

Halt controller 541m determines whether an accumulated time that has passed since the operation of the selected power storage rack was halted reaches 24 hours (S28). When the accumulated time has not reached 24 hours yet (N in S28), the process returns to step S24. When the accumulated time has already reached 24 hours (Y in S28), halt controller 541m terminates the halting of the selected power storage rack (S29). Then, the process returns to step S21.

The third exemplary embodiment described above produces substantially the same effect as the foregoing second exemplary embodiment. Halt controller 541m halts the operation of the power storage rack whose SOH is the lowest, so that the SOHs of the plurality of power storage racks 10 to 40 are equalized. This enables the plurality of power storage racks 10 to 40 to be replaced at similar timings. There are cases where the SOHs of the plurality of power storage racks 10 to 40 differ from one another due to a variation in their performances and a difference in ambient condition even when power storage racks 10 to 40 are interconnected in parallel and operate for the same period. The third exemplary embodiment, however, makes it possible to equalize the rates at which the SOHs are lowered.

The function of master management device 50*m* described above may be realized by any of the plurality of rack management units 50*a* to 50*d*. If the function of master management device 50*m* is realized by first rack management unit 50*a*, for example, first rack management unit 50*a* serves as a master management unit, and second rack management unit 50*b* to fourth rack management unit 50*d* each serve as a slave management unit.

Figure 9:
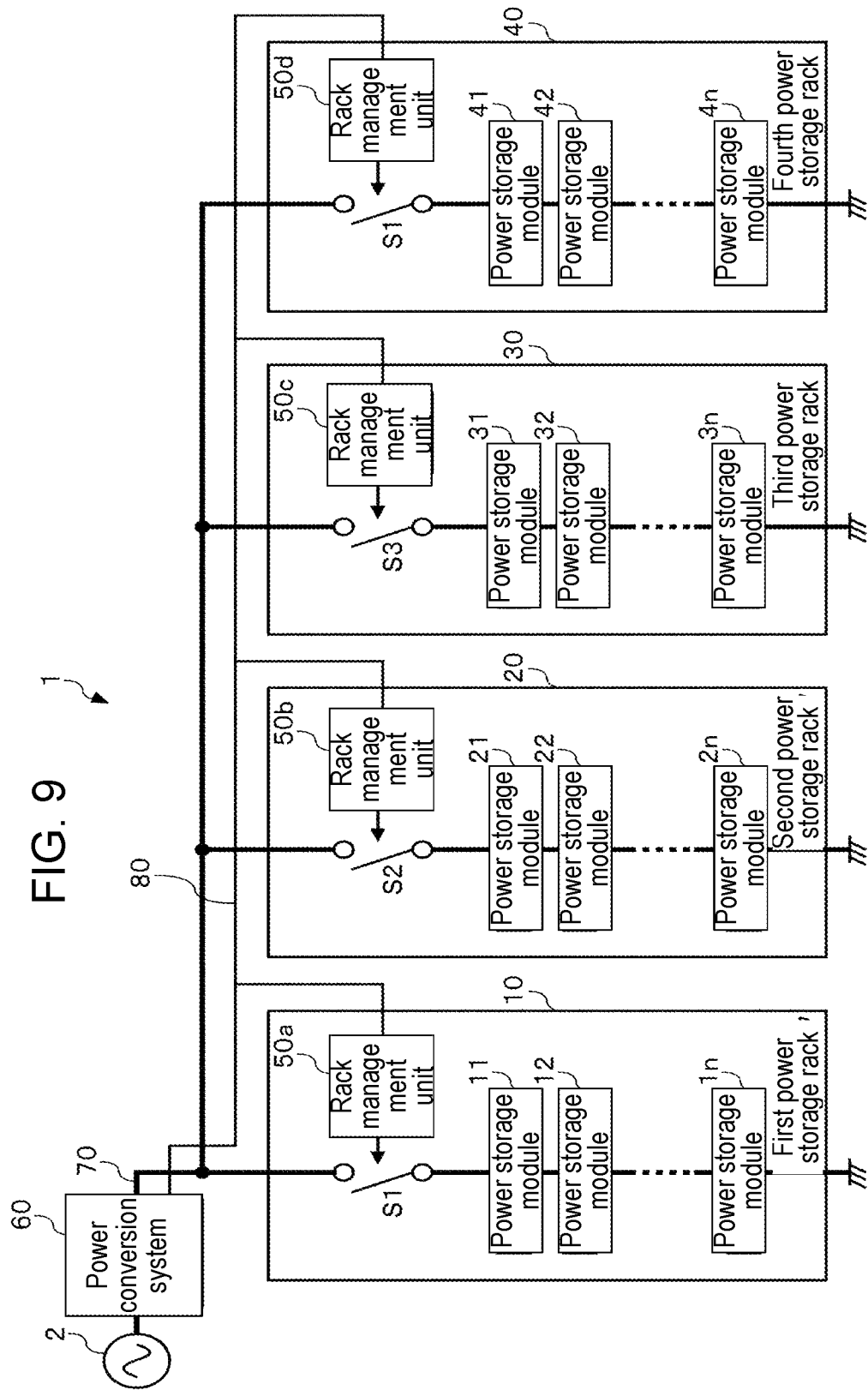
FIG. 9 is a view of a configuration of a power storage system in which a function of the master management device is realized by a power conversion system.

Alternatively, the function of master management device 50*m* described above may be realized by power conversion system 60. FIG. 9 is a view of a configuration of power storage system 1 in which the function of master management device 50*m* is realized by power conversion system 60. As opposed to the configuration of power storage system 1 illustrated in FIG. 1, master management device 50*m* is not provided, and communication line 80 is connected to power conversion system 60.

Figure 10:
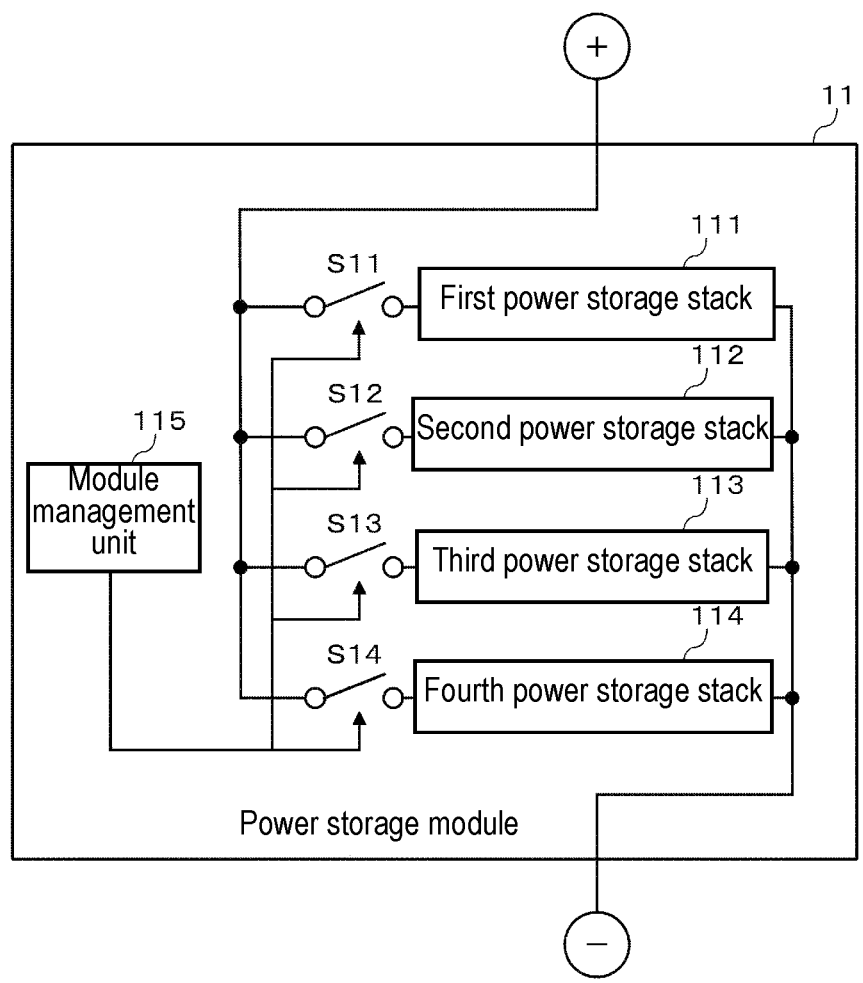
FIG. 10 is a view of an internal configuration of a power storage module.

FIG. 10 is a view of an internal configuration of power storage module 11. Power storage module 11 includes a plurality of power storage stacks (first power storage stack 111, second power storage stack 112, third power storage stack 113, and fourth power storage stack 114 in FIG. 10) interconnected in parallel. Each of the power storage stacks includes a plurality of power storage cells interconnected in series.

Between first power storage stack 111 and a first electrode terminal (positive electrode terminal in FIG. 10) is first stack switch S11 connected. Between second power storage stack 112 and the first electrode terminal is second stack switch S12 connected. Between third power storage stack 113 and the first electrode terminal is third stack switch S13 connected. Between fourth power storage stack 114 and the first electrode terminal is fourth stack switch S14 connected. Examples of each of the stack switches include a relay and a semiconductor switch.

Module management unit 115 subjects the plurality of power storage stacks 111 to 114 to halt control, which corresponds to the above halt control performed by halt controller 541*m*. By replacing the above power storage racks with the power storage stacks, the description of the halt control of the plurality of power storage racks 10 to 40 can be applied to the halt control of the plurality of power storage stacks 111 to 114. It should be noted that both the halt control of the plurality of power storage racks 10 to 40 and the halt control of the plurality of power storage stacks 111 to 114 may be performed together, or either one may be performed.

The present invention has been described based on the exemplary embodiments. The person of the ordinary skill in the art can understand that the exemplary embodiments are illustrative, combinations of these constitution elements and combined processes can be modified, and such modified examples fall within the scope of the present invention.

In the foregoing exemplary embodiments, the operation of only one power storage rack is halted over the halt time interval. However, the operations of a predetermined number of (two or more) power storage racks may be halted over the halt time interval.

In the foregoing exemplary embodiments, the halt period is set to 24 hours. However, the halt period may be set in consideration of the degree to which the entire power storage system has recovered and ease of the halt control. More specifically, the halt period may be set as appropriate based on the type of storage batteries, the number of power storage devices interconnected in parallel, and a usage method.

The exemplary embodiments may be specified by items described below.

[Item 1]

Management device (50*m*) that manages a plurality of power storage devices (10 to 40) interconnected in parallel, management device (50*m*) including halt controller (541*m*) that halts an operation of at least one of the plurality of power storage devices (10 to 40) during a period in which charged/discharged power between the plurality of power storage devices (10 to 40) and load (2) is less than a set value.

This configuration can reduce an electric-current burden on power storage devices (10 to 40) but improve the reversible deteriorations of power storage devices (10 to 40).

[Item 2]

Management device (50*m*) according to Item 1, in which during the period in which the charged/discharged power is less than the set value, halt controller (541*m*), by turns, halts an operation of one of the plurality of power storage devices (10 to 40) at set time intervals.

This configuration can reduce an electric-current burden on power storage devices (10 to 40) but uniformly improve the reversible deteriorations of power storage devices (10 to 40).

[Item 3]

Management device (50*m*) according to Item 1, in which during the period in which the charged/discharged power is less than the set value, halt controller (541*m*) halts an operation of one (10) of the plurality of power storage devices (10 to 40) which has the lowest state of health (SOH) over a set time interval.

This configuration can equalize the SOHs of power storage devices (10 to 40).

[Item 4]

Management device (50*m*) according to Item 2 or 3, in which when the charged/discharged power becomes equal to or more than the set value, halt controller (541*m*) temporarily recovers power storage device (10) whose operation has been halted, and when the charged/discharged power becomes less than the set value, halt controller (541*m*) halts the operation of the temporarily recovered power storage device (10).

This configuration can control an increase in the electric-current burden on each of power storage devices (10 to 40).

[Item 5]

Power storage system (1) including: a plurality of power storage devices (10 to 40) interconnected in parallel; and management device (50*m*) according to any one of Items 1 to 4, the plurality of power storage devices (10 to 40) being connected to management device (50*m*) by communication line (80).

This configuration can reduce an electric-current burden on power storage devices (10 to 40) but improve the reversible deteriorations of power storage devices (10 to 40).

[Item 6]

Power storage system (1) including: a plurality of power storage devices (10 to 40) interconnected in parallel; and power conversion system (60) that converts direct current (DC) power discharged from the plurality of power storage devices (10 to 40) interconnected in parallel into alternating current (AC) power and then outputs the AC power to power system (2), and in turn converts AC power received from power system (2) into DC power and then charges the plurality of power storage devices (10 to 40) interconnected in parallel with the DC power, power conversion system (60) including halt controller (541m) that halts an operation of at least one of the plurality of power storage devices (10 to 40) during a period in which charged/discharged power between the plurality of power storage devices (10 to 40) and power system (2) is less than a set value.

This configuration can reduce an electric-current burden on power storage devices (10 to 40) but improve the reversible deteriorations of power storage devices (10 to 40).

The invention claimed is:

1. A management device for managing a plurality of power storage devices interconnected in parallel, the management device comprising:
   a halt controller that halts an operation of at least one of the plurality of power storage devices during a period in which charged/discharged power between the plurality of power storage devices and a load is less than a set value,
      wherein during the period in which the charged/discharged power is less than the set value, the halt controller sequentially halts an operation of each power storage device of the plurality of power storage devices for a set time interval, and
      wherein when the charged/discharged power becomes equal to or more than the set value, the halt controller temporarily recovers the power storage device whose operation has been halted, and when the charged/discharged power becomes less than the set value, the halt controller halts the operation of the temporarily recovered power storage device.

2. A power storage system comprising:
a plurality of power storage devices interconnected in parallel; and
the management device according to claim 1,
   wherein the plurality of power storage devices are connected to the management device by a communication line.

3. A power storage system comprising:
a plurality of power storage devices interconnected in parallel; and
a power conversion system that converts direct current (DC) power discharged from the plurality of power storage devices interconnected in parallel into alternating current (AC) power and then outputs the AC power to a power system, and in turn converts AC power received from the power system into DC power and then charges the plurality of power storage devices interconnected in parallel with the DC power,
   wherein the power conversion system includes a halt controller that halts an operation of at least one of the plurality of power storage devices during a period in which charged/discharged power between the plurality of power storage devices and the power system is less than a set value,
   wherein during the period in which the charged/discharged power is less than the set value, the halt controller sequentially halts an operation of each power storage device of the plurality of power storage devices for a set time interval, and
   wherein when the charged/discharged power becomes equal to or more than the set value, the halt controller temporarily recovers the power storage device whose operation has been halted, and when the charged/discharged power becomes less than the set value, the halt controller halts the operation of the temporarily recovered power storage device.

4. A power storage system comprising:
a plurality of power storage devices interconnected in parallel; and
the management device according to claim 1,
   wherein the plurality of power storage devices are connected to the management device by a communication line.

* * * * *